United States Patent [19]
Caballero

[11] Patent Number: 5,277,940
[45] Date of Patent: * Jan. 11, 1994

[54] METHOD FOR TREATING DIAMONDS TO PRODUCE BONDABLE DIAMONDS FOR DEPOSITING SAME ON A SUBSTRATE

[75] Inventor: Luis X. Caballero, Mexico City, Mexico

[73] Assignee: Diamond Technologies Company, Louisville, Ky.

[*] Notice: The portion of the term of this patent subsequent to Nov. 17, 2009 has been disclaimed.

[21] Appl. No.: 977,237

[22] Filed: Nov. 16, 1992

Related U.S. Application Data

[63] Continuation of Ser. No. 605,080, Oct. 29, 1990, Pat. No. 5,164,220.

[51] Int. Cl.⁵ .................. B05D 3/06; B05D 1/36; B05D 7/00; C23C 16/00
[52] U.S. Cl. .................. 427/577; 427/578; 427/203; 427/204; 427/214; 427/215; 427/255.4; 427/404; 205/110; 205/114
[58] Field of Search ............ 427/577, 578, 202, 203, 427/204, 213.31, 214, 215, 255.4, 404, 419.7, 430.1, 563; 205/109, 110, 114; 423/446

[56] References Cited

U.S. PATENT DOCUMENTS

| | | | |
|---|---|---|---|
| 3,293,012 | 12/1966 | Smiley et al. | |
| 3,372,010 | 3/1968 | Parsons | |
| 3,617,347 | 11/1969 | Kuratomi | 427/215 |
| 3,641,718 | 2/1972 | Ferchland | |
| 3,826,630 | 7/1974 | Roy | |
| 3,871,840 | 3/1975 | Wilder et al. | 427/215 |
| 3,894,673 | 7/1975 | Lowder | |
| 3,919,717 | 11/1975 | Cullen et al. | |
| 4,119,500 | 10/1978 | Ishizuka et al. | |
| 4,184,853 | 1/1980 | Otopkov et al. | 427/214 |
| 4,275,528 | 6/1981 | Higgenbotham | |
| 4,358,922 | 11/1982 | Feldstein | 427/419.7 |
| 4,381,227 | 4/1983 | Narcus | |
| 4,647,494 | 3/1987 | Meyerson et al. | 427/39 |
| 4,659,436 | 4/1987 | Kaylor | |
| 4,919,974 | 4/1990 | McCune et al. | |
| 4,988,421 | 1/1991 | Draw et al. | 427/202 |
| 5,164,220 | 11/1992 | Caballero | 427/577 |

Primary Examiner—Marianne Padgett
Attorney, Agent, or Firm—Polster, Lieder, Woodruff & Lucchesi

[57] ABSTRACT

A metastable crystal layer is deposited by chemical plasma deposition on diamonds at subatmospheric pressure ($10^{-3}$ Torr) at 850°–1050° C. The metastable layer enables the diamond to be metallurgically bonded to a suitable substrate.

15 Claims, 8 Drawing Sheets

250X

FIG. 1A
FIG. 1B
Si
C
|—————| 100 MICRONS
FIG. 2
3X

320X

Si

N

C

|—————|
100 MICRONS

500X

15KV 500K

100X

200X

250X

METHOD FOR TREATING DIAMONDS TO PRODUCE BONDABLE DIAMONDS FOR DEPOSITING SAME ON A SUBSTRATE

This is a continuation of copending application Ser. No. 07/605,080, filed on Oct. 29, 1990, now U.S. Pat. No. 5,164,220.

BACKGROUND OF THE INVENTION

The present invention relates to the bonding of diamonds to suitable substrates, and more particularly, to the treatment of the diamonds to metallurgically bond the diamonds to the substrate.

This invention relates to a process for growing of a metastable crystal layer over diamonds, silicon carbide, or cubic boron nitride by chemical plasma deposition under subatmospheric pressure and relatively low temperature. This can produce a metallurgical bond when mixed with suitable metal powder at its liquid or eutectic temperature and high pressure. It is also possible to produce a metallurgical bond in an aqueous solution having a heterogeneous catalyst, if used with square wave pulse current.

Several processes are disclosed in the patents and literature mentioned in the references but all use the growth of diamonds with the object of producing synthetic diamonds, departing from a diamond seed. Obviously, the principal disadvantage of all of these processes is in terms of economical considerations, at least until now.

Hibshman, U.S. Pat. No. 3,371,996, Angus et al, U.S. Pat. No. 3,661,526, and Vickery, U.S. Pat. No. 3,714,334, disclose processes for growing diamonds by facilitating or catalyzing a reaction between hydrogen and a hydrocarbon to form crystal carbon. Hibshman discloses a catalytic diamond growth process in which a solid, particulate catalytic metal is mixed with finely divided diamond seed and contacted with CO gas at a pressure of 1 atm–2000 atm and temperature of 600° C. to 1100° C.

Angus et al deposits a layer of a catalytic metal on the diamond seed surface and passes methane gas over the diamond at pressures of $10^{-8}$–759 Torr and temperatures of 800° to 700° C. The catalyst acts as a catalytic mobile transfer medium which aids in promoting the transition of carbon in the form of a precursor in the vapor phase to the metastable diamond in the solid phase. Angus further states that the catalytic mobile transfer medium may contain materials, such as nickel, which will inhibit the formation of elemental carbons (carbides).

Strong, U.S. Pat. No. 2,947,609, discloses a process for forming diamonds under high pressure (5000 to 115000 atm) and high temperature (1200° C. to 2600° C.) in the presence of a catalyst. Strong discloses that diamond forms at the interface of the catalyst alloy and carbonaceous material.

Caveney, U.S. Pat. No. 3,879,901, Vereschagin et al, U.S. Pat. No. 3,912,500, and Bakul et al, U.S. Pat. No. 4,097,274, disclose processes for producing diamond compacts. They compress diamond powder and a metallic binder under high pressure and temperature forming a diamond matrix which is filled and held together with the metallic binder.

St. Pierre et al, U.S. Pat. No. 4,220,455, Lee et al, U.S. Pat. No. 4,234,661, and Morelock, U.S. Pat. No. 4,247,304, disclose a process for forming a diamond compact by infiltrating a mass of diamonds coated with elemental non-diamond carbon with fluid silicon. The silicon reacts with non-diamond carbon to bind the diamonds together by a bonding medium of silicon carbide and elemental silicon. These patents disclose that the body may be formed on a substrate and that the liquid silicon, during infiltration, may penetrate the substrate to bond the diamond body or compact to the substrate.

These patents disclose processes for growing diamond crystals and creating diamond compacts. None disclose treating a diamond to enable the treated diamonds to bond to a suitable metal powder, or a the deposition of a metal and the treated diamond on a substrate by electrolytic or chemical plasma deposition.

One object of the invention is to provide a novel method for producing bondable diamonds, silicon carbide or cubic boron nitride.

Another object is to provide a container in which to produce such bondable diamonds.

Another object is to provide such a bondable diamond which will bond with a suitable substrate.

Another object is to provide such a bondable diamond which may be used for manufacturing cutting tools.

Another object is to provide such a bondable crystal which may be used for manufacturing a rotary cutting tool by electroplating but in the presence of a catalyst.

Other objects inherent in this invention will be better understood by reference to the description and examples.

SUMMARY OF THE INVENTION

In accordance with this invention, generally stated, it is possible to grow an epitaxial metastable crystal layer on diamonds as well as SiC or cubic boron nitride CBN, by placing the crystals in contact with a suitable silane in an environment consisting of 96% $H_2$ by volume and no more than 4% of the silane. The diamond is treated at a temperature in the range of about 800° C. to about 1050° C., at a subatmospheric pressure of $1 \times 10^{-3}$ Torr, in the presence of a catalyst selected from the platinum group. The diamond crystals react with the silane and hydrogen gas to produce the crystal layer.

The epitaxial metastable crystal layer on the diamond, SiC or cubic boron nitride will react when mixed with a suitable metal powder under pressure at liquid or eutectic temperatures to produce a metallurgical bond with the metal.

The treated diamond, SiC or cubic boron nitride can be used for manufacturing abrasive tools, drawing dies, cutting tools, etc., by hot press or sintering. It is also possible to manufacture rotary tools by electroplating. Preferably the electroplating is performed using a square wave current and a catalyst which will catalyze the reaction of the metastable crystal layer with metal which deposited on the substrate.

BRIEF DESCRIPTION OF THE FIGURES

FIGS. 1(A) and 1(B) are an X-ray map of diamonds treated in accordance with the invention;

FIG. 2 is a photomicrograph of steel coated with a tungsten carbide cloth mixed with the treated diamonds and which was used in a dry abrasion test;

DESCRIPTION OF THE PREFERRED EMBODIMENT

Figure 3:
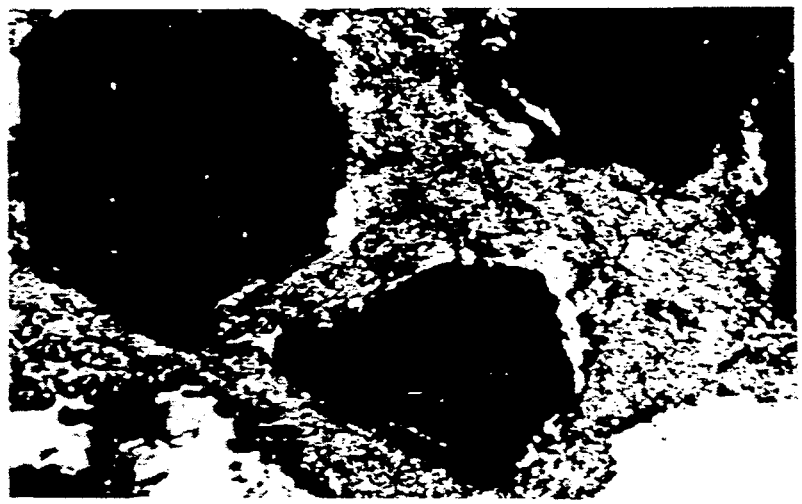
FIG. 3 is a photomicrograph of a section of the coated steel specimen of FIG. 2 after the abrasion test.
Figure 4A:
FIGS. 4(A), 4(B), 4(C) and 4(D) are photomicrograph of a cross-section of the coating of FIG. 2.
Figure 4B:
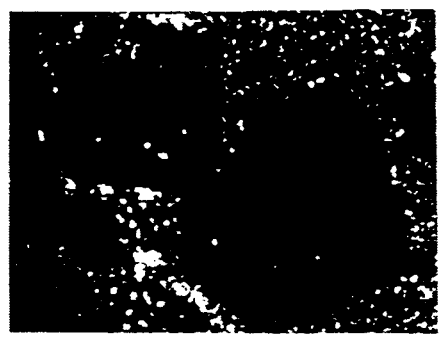
Figure 4C:
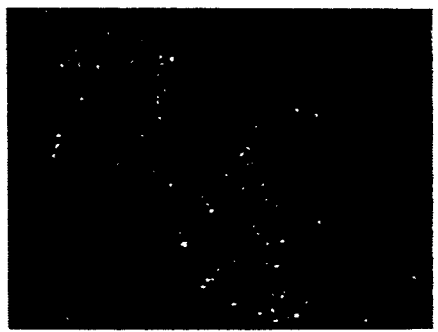
Figure 4D:

Diamonds are, of course, crystalline carbon. Their structure is an interlaced face centered cubic crystal from which tetrahedral bonding is generated by covalent bonds.

Every carbon atom has four covalent bonds with the exception of the atoms at the surface of the crystal. These atoms have only three covalent bonds leaving one bonding site per atom unfulfilled. The oxide of a diamond is carbon dioxide, a gas at normal conditions of temperature and pressure. Therefore, carbon dioxide cannot fulfill the surface bonding requirements of diamond. Given these conditions, airborne dust particles and oil in the average home are sufficient to coat the surface of the diamond and help to satisfy its need for a bond. Under some conditions the unfulfilled covalent bond will have an extreme affinity for hydrocarbons and/or silicons. This affinity is used, as is described below, for the epitaxial growth of a metastable crystal layer on the diamond which will allow the diamond to bond to metallic substrates.

To grow the metastable layer, the diamond surface must be clear of any impurities, such as the above-mentioned dust and oil. The diamond is initially cleaned with solvents such as trichloroethylene or ethyl-methyl-ketone, and then cleaned with nitric, sulfuric and hydrofluoric acids. The diamond surface is then etched with the vapors of hydrofluoric acid and nitrogen.

After these preliminary treatments, the diamond is placed in a tungsten carbide crucible which is then inserted in a plasma reactor wherein the diamond is treated. The crucible is plated with a catalyst, preferably platinum. The crucible is connected at one end to a positive pole and at the other end to a negative pole of a DC power source. The size of the crucible should be large enough to contain the amount of diamond desired. It should also be proportional to the size of the plasma reactor. The reactor is preferably in a horizontal position.

Before treating the diamonds, the reactor and diamonds are purged and cleaned. This is done by first purging the reactor with nitrogen. The reactor is then raised to 750° C. for annealing at a pressure of one torr. The diamonds are then washed in a hydrogen atmosphere at 900° C. for 24 hours at a pressure of $1 \times 10^{-3}$ Torr. The reactor is then purged with nitrogen and cooled for about 180 to 240 minutes.

After the purging and cleaning, the metastable crystal layer is grown by reacting silane with hydrogen in the presence of a catalyst (preferably platinum) at the pressure of $1 \times 10^{-3}$ Torr and temperature in the range of about 800° C. to about 1050° C. The silane is preferably a dialkyldichlorosilane, preferably dimethyldichlorosilane or diethyldichlorosilane. The reaction of the silane and hydrogen disassociates the silane to produce hydrocarbons, silicon, and HCl in accordance with the following reaction:

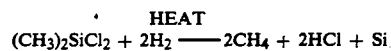

$$(CH_3)_2SiCl_2 + 2H_2 \xrightarrow{\text{HEAT}} 2CH_4 + 2HCl + Si$$

The atomic silicon liberated in this reaction, when contacting the surface of the diamonds, orients itself in the exact configuration of the diamonds and is deposited thereon. Because of the environment surrounding the diamonds as well as the temperature conditions employed, the silicon reacts with the carbon (diamond) to produce silicon carbide metastable crystal layer on the diamond surface. The silicon carbide is formed in accordance with the following reaction:

$$Si + C \xrightarrow[\text{Heat}]{\text{CATALYST}} SiC$$

As in all processes the reaction conditions are extremely important to an efficient operation.

The desirable temperature for disassociation of the silane in order to liberate silicon is about 800° C. to about 1050° C. This temperature assures that no elemental carbon is formed from the diamonds (i.e. the diamond is not depleted) before the silicon bonds at the empty bonding sites to fulfill the bonding requirements. The pressure is preferably $1 \times 10^{-3}$ Torr.

The environment surrounding the diamonds during the growth of a metastable crystal layer consists of at least 96% hydrogen and about 4% or less silane, by volume. Of course, the silane is the source of silicon, but the hydrogen gas is another important component of the environment surrounding the diamonds. The purpose of the hydrogen gas is to react with the Silane resulting in the breakdown that will liberate the silicon. The hydrogen gas, in the presence of the catalyst and under temperature conditions of between 800° C. and 1050° C., will ionize and react with the silane to form hydrocarbon gas and hydrochloride gas and to liberate the silicon. The liberated silicon will then react with the diamonds, fulfilling the surface bonding sites and will grow on the surface of the diamonds. The silicon reacts with the diamond to form SiC. The metastable crystal layer will react later with any suitable metal powder under high pressure at liquid or eutectic temperatures of the metal, allowing a metallurgical bond with the metal. The bond should react in an aqueous medium, e.g. suitable plating solution where a heterogeneous catalyst of group VIII of the Periodic Table is present to plate a substrate.

The catalyst plated tungsten carbide crucible acts as a secondary source of heat, independent of the source of power of the reactor during the reaction. This additional source of heat helps sustain the temperature of the solid crystals at the same level as the gas environment.

EXAMPLE 1

One thousand carats of diamonds, mesh 100/120, were deposited in the crucible. After cleaning with solvents and acids as above, the crucible containing the diamonds was placed inside of the chemical plasma deposition reactor. The reactor was closed, and the diamonds were cleaned with hydrogen for 24 hours as described above, leaving the surface atomic layer free at the empty bonding site.

The reactor was purged with nitrogen and annealed at 650° C. for 30 minutes, creating a gaseous atmosphere. The atmosphere included by volume, 99% hydrogen gas and 1% dimethyldichlorosilane (DMDCS) gas. The DMDCS gas is produced by induction heating DMDCS at 69°-72° C. at which point it evaporates to produce gas. The reactor temperature was then raised to, and maintained at, 875° C. The reactor pressure was maintained at $1 \times 10^{-3}$ Torr.

The reaction was performed in the presence of the catalyst which lined the crucible containing the diamonds.

After 48 hours the chemical plasma deposition reactor was cooled for four hours and evacuated.

When the reactor was opened, the crucible containing the 1000 carats of diamonds was examined and the diamonds were removed. The diamonds appeared a little darker then before the treatment, but were still transparent. The total weight was 1001 carats (100.2 grams). In other words the metastable crystal layer growth was 0.1% by weight.

The treated diamonds were then tested.

EXAMPLE 2

A small sample of the treated diamonds were first examined using the SEM-EDS unit to determine the approximate concentration of the elements heavier than Sodium. Silicon was detected on the diamonds; no other elements were detected to any appreciable degree. FIGS. 1 and 4 presents an X-ray map of elements encountered in the sample. It is clear that the treated diamonds had silicon and carbon associated with the surface which partially diffused into the interior of the diamonds.

Two $1 \times 3$ inch abrasion test samples were made of 1018 steel were covered with a tungsten carbide cloth with treated diamonds thereon. The samples coated with the cloth and diamonds were braze-infiltrated with Nicrobraz-120, a nickel-base brazing filler having 70–76% Ni, 13–15% Cr, 4–5% Fe, 3–5% Si, 2.8–4% B, and 0.6–0.9% C, available from Wall Colmonoy Corporation in Detroit, Mich., in a dry hydrogen atmosphere at 2150° F. (1177° C.) and 1 Torr for five minutes. A brazing filler of the same composition is available from the Metco division of Perkin Elmer under the trade name Metco-15E.

The two coated steel specimens were surface-ground using a water-cooled diamond-rimmed wheel 8" in diameter and 0.5" in width. The wheel was operated at 2300 RPM; the table feed was manually controlled. In sharp contrast to the regular grinding of the tungsten carbide cloth coating, the tungsten carbide cloth mixed with the treated diamonds was clearly more difficult to finish. In fact the grinding wheel was finished, rather then the sample, showing that the diamond covered steel was very abrasive. In order to conserve the grinding wheel, a section of only 1.5–2.0 inches was finished. (FIG. 2).

The specimens were then tested using procedure of the ASTM G-65 standard on dry sand rubber abrasion testing. Both samples tended to deeply groove the rubber rim of the steel wheel. In both instances the diamond particles were left standing proud.

The abrasion tested samples were sectioned and prepared for metallographic examination. Representative photomicrographs are given in FIG. 3. In general, the microstructure showed excellent integrity at the interface between the diamond and tungsten carbide coating and the 1018 steel substrate.

In order to confirm the chemistry of the diamonds, a qualitative microanalysis was performed on the polished cross-section of the coating. An examination with a microprobe showed that the diamond particles were rich in carbon. The silicon, which was associated with the diamond surface, appeared to have diffused into the diamond matrix. (FIGS. 4A–4D)

EXAMPLE 3

A group of 25 tip-tests made of titanium (90%), aluminum (6%) and vanadium (4%) (Ti-6Al-4V) was placed in a special device to plate the tips with an alloy and the treated diamonds by chemical plasma deposition. The tip-tests were activated with a solution of iodine and methanol. The device had a shape that permitted intimate contact of the tip-tests with the treated diamonds. The device also allowed the pieces to fit in the crucible.

Once the device was adequately prepared, it was placed in the reaction chamber of the chemical plasma deposition reactor which was then closed. First the reactor containing the device with the tip-test pieces and diamonds was purged with nitrogen. The reactor temperature was raised to 225° C. and the tip-tests and diamonds were annealed for 30 minutes at a pressure of one Torr. The reactor was purged again with hydrogen gas. The temperature was then raised to 285° C. and a line connected to a heated bottle containing nickel and cobalt salts and boron was opened. The heated bottle contained about 1 mole $NiSO_4$, 0.25 mole $NiCl_2$, 0.125 mole $CoSO_4$, and 0.0125 mole B. Hydrogen gas was used as a carrier for the nickel, cobalt, and boron salts. The reaction took place at a pressure of $1 \times 10^{-3}$ Torr. The reactor atmosphere was 96% $H_2$ and 4% metal compounds. After 3.5 hours, the reactor was purged with nitrogen and cooled for about two hours.

The reactor was opened and the device containing the tip-tests and the treated diamonds was removed. The excess diamonds were carefully removed so that the condition of the tip-tests now coated with the bondable diamonds and the Ni-Co-B alloy could be evaluated. The first optical microscopic examination showed a single layer of diamonds with a protrusion of about 30% of the average size of the diameter of the diamond crystals.

Figure 5:
FIG. 5 is is a photomicrograph of a Ti-6Al-4V substrate coated with a NiCoB alloy and treated diamonds from a chemical plasma deposition procedure.

One of the tip-tests was cut and prepared for electron-microscopic examination It was found that the Ni-Co-B alloy was diffused into the Ti-6Al-4V and the diamonds were perfectly bonded to the Ni-Co-B, forming a single unit (FIG. 5).

EXAMPLE 4

A device was prepared which permitted 100 pieces of specially shaped dental burs to be connected to a source of power for electrolytic plating. The device also contained an adequate quantity of diamonds to allow intimate contact with the metal substrate; in this case the shaped dental burs.

The dental burs and treated diamonds were lowered into a plating bath to electrolytically plate the burs with an alloy coating and the treated diamonds of Example 1. An electrolytic bath was used containing nickel metal (54%), cobalt metal (44%), boron (2%) in the presence of a catalyst, preferably solid palladium. Nickel anodes were used. The source of power was a pulse square wave current having a 30% duty cycle and a frequency of 1000 Hz, the temperature of the solution was 66° C., and the Ph was 3.8. The electrolytic plating process preferably is performed as described in my co-pending application Ser. No. 594,570, filed on Oct. 9, 1990 and which is incorporated herein by reference.

The electrolytic process was done in about 90 minutes at an average of 0.570 amperes. When the operation was completed, the device containing the metal substrate and the diamonds was removed. After removing the excess diamonds, the dental burs were cleaned with distilled water and disconnected from the device.

Figure 6:
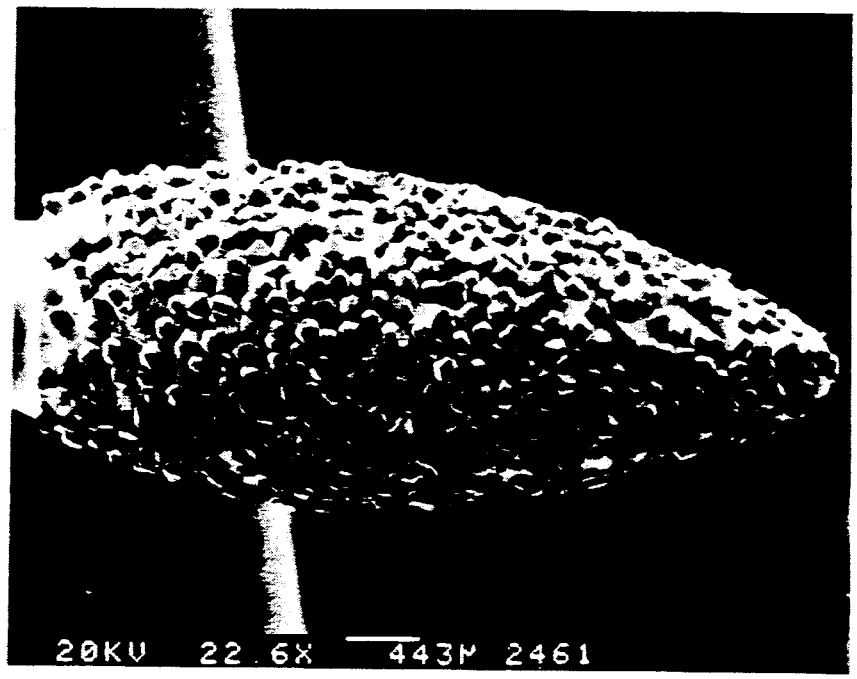
FIGS. 6 and 7 are photomicrographs of treated diamonds bonded to NiCoB alloy in a electrodeposition procedure, with approximately 80% of the diamond protruding from the alloy.
Figure 7:
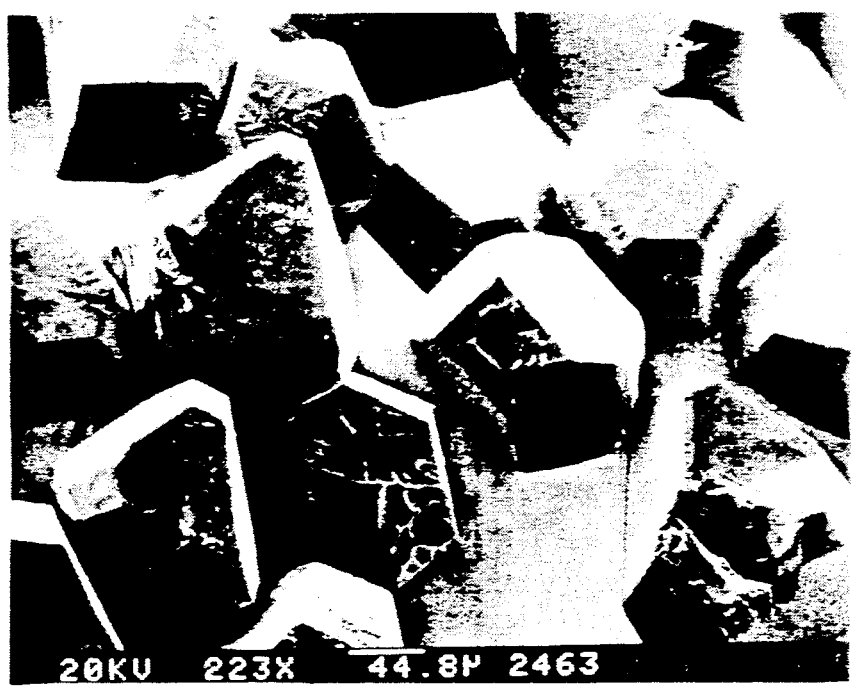
Figure 8:
FIG. 8 is a photomicrograph showing the treated diamonds and the NiCoB alloy after electrolytic deposition on a dental bur, with approximately 30% of the diamond protruding from the alloy.

The amount of metal deposited had been planned to have 80% of the average diameter of the diamonds to extend beyond the metal to test if the diamonds were bonded to the stainless steel substrate. The deposition time can be determined from Faraday's law. Microscopic examination showed that the calculation of the deposited metal was correct. The metal was brilliant and beautiful. The diamonds were perfectly bonded to the Ni-Co-B alloy formed in the aqueous solution. FIGS. 6 and 7 show the disposition of the diamonds with 80% of their average diameter extending beyond the metal alloy.

Figure 9:
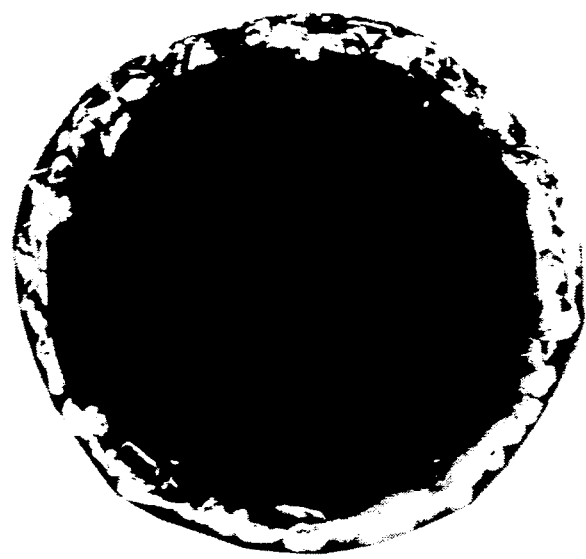
FIGS. 9 and 10 are photomicrographs showing bonding between a NiCoB alloy to a substrate and to the treated diamonds.
Figure 10:

The diamonds were not encapsulated, like a peanut, by the deposited metal, but were bonded in the strict sense of the word to the metal. (FIGS. 5, 9, and 10).

EXAMPLE 5

The same electrolytic bath was used as in EXAMPLE 4, with the object of proving the control of metal deposition on a substrate with the shape of a cylindrical dental bur. A device was prepared which could be at the same time a connector and a container of diamonds. The calculations were made so that the alloy would cover 70% of the average diameter of the crystals.

The solution was prepared at the temperature of 66° C. at 3.8 Ph and with a metal concentration of 54% Ni, 44% Co, 2% B. The source of power was set at 1000 Hz; 0.3 ms $T_{ON}$ and 0.7 ms $T_{OFF}$.

The run was divided into three steps. First, the substrate way electrolytically plated with a layer of Ni-Co-B alloy. The average substrate was immersed in the plating bath. The current used for the coating was set at 0.590 amps for 12 minutes, 52 seconds for a total of 7.60 amps min. This produced a metastable layer of the alloy on the substrate.

Second, the coated substrate was placed in intimate contact with the treated diamonds. An average current of 0.140 amps for 43 minutes, 21 sec. for a total of 6.07 amps min. was passed through the substrate. This bonded the diamond to the metal. The silicon which was placed on the diamond diffused into the alloy to bond the diamond to the alloy which was coated on the substrate.

Figure 11:
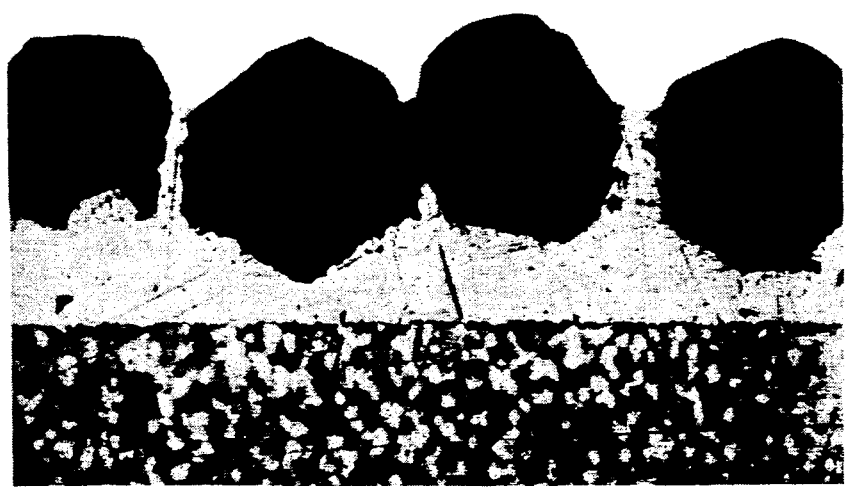
FIG. 11 is a photomicrograph showing diamonds bonded to a substrate in accordance with Example 4.

Third, more NiCoB alloy was plated around the diamond. The alloy, however, is not deposited on the diamond, rather, the original layer of alloy grows around the diamond and bonds thereto. (FIG. 11). The average current used was set at 0.300 amps for 55 min., 24 sec. for a total of 16.62 amps min.

After 1 hour, 51 minutes, 37 seconds, which was the total time of the run, the device containing the dental burs and the excess diamonds was removed. After cleaning with distilled water, the dental burs were examined. The dental burs were found to have a single layer of diamonds, perfectly distributed. FIG. 7 shows the protrusion of about 30% of the crystals, as was calculated.

One of the dental burs was cut and prepared for metallurgical examination. The X-ray (FIGS. 9 and 10) showed perfect bonding of the deposited metal to the substrate and bonding between the deposited metal and the diamonds.

The forgoing is set forth for illustrative purposes and is not meant to be limiting. It will be understood that various modifications of the disclosed ranges of the present invention may be made. Numerous variations, within the scope of the appended claims.

Having thus described the invention, what is claimed and desired to be secured by Letters Patent is:

1. A method of treating diamond particles to enable the diamonds to bond to a metal comprising forming a metastable layer of silicon carbide on said diamond particles, by reacting silicon with diamond carbon to form said silicon carbide at a temperature below 1050° C. in the presence of a catalyst.

2. The method of claim 1 wherein said metastable layer forming step is performed by chemical plasma deposition.

3. The method of claim 1 wherein said metastable layer forming step includes:
   placing said diamond particles in a reactor;
   charging said reactor with a silane gas and hydrogen gas;
   reacting said silane and hydrogen at a temperature of between 800° C. and 1050° C. and $1 \times 10^{-3}$ Torr to produce silicon; and
   reacting said silicon with said diamond.

4. The method of claim 1 further including a step of cleaning the diamond prior to said metastable layer forming step comprising:
   purging said reactor with nitrogen after said diamond particles have been placed therein;
   annealing at about 750° C. and one Torr;
   soaking in a hydrogen atmosphere for about 24 hours at $1 \times 10^{-3}$ Torr;
   purging with nitrogen; and cooling for 180 min–240 min.

5. The method of claim 4 further including a prior step of cleaning said diamond before said step of placing said diamond in said reactor comprising washing said diamond with a solvent, washing said diamond with an acid, and etching said diamond with acid vapor in the presence of nitrogen.

6. A method of depositing diamond particles on a substrate, said method comprising treating said diamond particles at a temperature below 1050° C. in the presence of a catalyst to form a metastable silicon carbide layer on said diamond particles; depositing a metal alloy on said substrate, said alloy being bonded by a polar-covalent bond to said substrate as deposited; and metallurgically bonding said treated diamond particles to said metal alloy.

7. The method of claim 6 wherein said depositing step includes electrolytically depositing said alloy on said substrate 8. The method of claim 7 wherein said step of electrolytically depositing step includes:
   placing said substrate in intimate contact with said diamond particles;

lowering said substrate and diamond particles into a plating bath, said bath being at about 66° C. and a pH of about 3.8; and running a pulse wave current through said plating bath whereby said silicon difuses into said alloy and said diamond bonds to said alloy.

9. The method of claim 7 further including a step of growing said alloy around said diamond.

10. The method of claim 9, wherein said growing step includes electrolytically depositing more of said alloy around said diamonds, said further alloy being deposited on said first coating of said alloy.

11. The method of claim 6 where said depositing step includes depositing by chemical plasma deposition.

12. The method of claim 11 wherein said depositing step includes:

placing said substrate in intimate contact with said diamond particles;

placing said substrate and diamond particles in a chemical plasma deposition reaction chamber;

purging said reactor chamber with hydrogen;

charging said reaction chamber with metal salts; and maintaining said reaction chamber at about 285° C. and $1 \times 10^{-3}$ Torr for about 3.5 hours.

13. The method of claim 12 further including a step of cleaning the diamond prior to said depositing step comprising:

purging said reactor with nitrogen after said diamond particles have been placed therein; and annealing at about 225° C. and one Torr for about thirty minutes.

14. A method of treating diamond particles to enable the diamonds to bond to a metal comprising depositing a metastable layer of silicon carbide on said diamond particles, wherein silicon bonds with diamond carbon to form said silicon carbide and including a step of pre-cleaning said diamond particles to remove impurities from the surface of said diamond particles to free up outer bonding sites of carbon atoms at the surfaces of said diamond particles, said depositing step including a step of reacting a silicon-containing compound to produce silicon, and reacting said silicon with said diamond, said reacting steps being carried out at a temperature below 1050° C. in the presence of a catalyst.

15. The method of claim 14 wherein said step of producing silicon is carried out between 800° C. and 1050° C. at subatmospheric pressure in the presence of said diamond and in the presence of a catalyst.

* * * * *

UNITED STATES PATENT AND TRADEMARK OFFICE
CERTIFICATE OF CORRECTION

PATENT NO. : 5,277,940
DATED : January 11, 1994
INVENTOR(S) : Luis X. Caballero

It is certified that error appears in the above-indentified patent and that said Letters Patent is hereby corrected as shown below:

Column 3, Line 54, delete "diamond" and insert -- diamonds --

Column 8, Line 33, delete "1x10-$^3$" and insert -- 10-$^3$ --
Column 8, Line 43, delete "1x10-$^3$" and insert -- 10-$^3$ --

Signed and Sealed this

Twenty-second Day of November, 1994

Attest:

BRUCE LEHMAN

Attesting Officer

Commissioner of Patents and Trademarks